(12) United States Patent
Cao

(10) Patent No.: US 12,114,441 B2
(45) Date of Patent: Oct. 8, 2024

(54) DISPLAY PANEL AND ELECTRONIC APPARATUS

(71) Applicant: WUHAN CHINA STAR OPTOELECTRONICS SEMICONDUCTOR DISPLAY TECHNOLOGY CO., LTD., Wuhan (CN)

(72) Inventor: Huan Cao, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 442 days.

(21) Appl. No.: 17/604,834

(22) PCT Filed: Sep. 1, 2021

(86) PCT No.: PCT/CN2021/115932
§ 371 (c)(1),
(2) Date: Oct. 19, 2021

(87) PCT Pub. No.: WO2023/019644
PCT Pub. Date: Feb. 23, 2023

(65) Prior Publication Data
US 2023/0247782 A1    Aug. 3, 2023

(30) Foreign Application Priority Data
Aug. 18, 2021    (CN) .......................... 202110948054.0

(51) Int. Cl.
*H05K 5/02*    (2006.01)

(52) U.S. Cl.
CPC ................................ *H05K 5/0217* (2013.01)

(58) Field of Classification Search
CPC ... H05K 5/0217; G06F 1/1616; G06F 1/1652; G09F 9/301
See application file for complete search history.

(56) References Cited

U.S. PATENT DOCUMENTS

| 4,961,126 A | 10/1990 | Suzuki |
| 9,173,288 B1 * | 10/2015 | Kim ...................... G06F 1/1681 |
| 9,348,450 B1 * | 5/2016 | Kim .................... H04M 1/0268 |

(Continued)

FOREIGN PATENT DOCUMENTS

| CN | 106205385 A | 12/2016 |
| CN | 209591356 U | 11/2019 |

(Continued)

*Primary Examiner* — Sagar Shrestha
(74) *Attorney, Agent, or Firm* — The Roy Gross Law Firm, LLC; Roy Gross

(57) ABSTRACT

The present disclosure provides a display panel and an electronic apparatus. The display panel includes a housing, a supporting component, and a display panel body The display panel body is attached to a side of the supporting component away from the housing, and the display panel body is configured to move along with movement of the supporting component. When the supporting component moves to a first position, the display panel body is in a bent state, and a first housing portion and a second housing portion of the housing are fitted. Thereby, a problem that there is a gap after a housing of a conventional inward-folding wedge-shaped display device is closed is resolved.

14 Claims, 4 Drawing Sheets

(56) References Cited

U.S. PATENT DOCUMENTS

| | | | | |
|---|---|---|---|---|
| 9,600,035 B2* | 3/2017 | Park | ............... | G06F 1/1681 |
| 10,975,603 B2* | 4/2021 | Tazbaz | ............... | G06F 1/1616 |
| 11,812,568 B2* | 11/2023 | Xie | ............... | G06F 1/1652 |
| 11,868,182 B2* | 1/2024 | Cui | ............... | G06F 1/1681 |
| 11,886,255 B2* | 1/2024 | Lee | ............... | G06F 1/1641 |
| 11,914,433 B2* | 2/2024 | Liao | ............... | G06F 1/1652 |
| 2015/0185782 A1* | 7/2015 | Kim | ............... | G06F 1/1652 |
| | | | | 156/212 |
| 2015/0330614 A1* | 11/2015 | Lee | ............... | B65D 85/38 |
| | | | | 206/45.23 |
| 2015/0366089 A1* | 12/2015 | Park | ............... | G06F 1/1641 |
| | | | | 361/679.01 |
| 2017/0374749 A1* | 12/2017 | Lee | ............... | G06F 1/1652 |
| 2019/0268456 A1* | 8/2019 | Park | ............... | E05D 5/06 |
| 2020/0225710 A1* | 7/2020 | Pelissier | ............... | G06F 1/1637 |
| 2021/0341972 A1* | 11/2021 | Togashi | ............... | G06F 1/1652 |
| 2021/0408445 A1* | 12/2021 | Sim | ............... | F16C 11/04 |
| 2022/0061174 A1* | 2/2022 | Xie | ............... | G06F 1/1652 |

FOREIGN PATENT DOCUMENTS

| | | |
|---|---|---|
| CN | 111681548 A | 9/2020 |
| CN | 111739417 A | 10/2020 |
| CN | 111885235 A | 11/2020 |
| CN | 113202857 A | 8/2021 |

* cited by examiner

DISPLAY PANEL AND ELECTRONIC APPARATUS

CROSS REFERENCE TO RELATED APPLICATIONS

This application is a National Phase of PCT Patent Application No. PCT/CN2021/115932 having International filing date of Sep. 1, 2021, which claims the benefit of priority of Chinese Application No. 202110948054.0 filed on Aug. 18, 2021. The contents of the above applications are all incorporated by reference as if fully set forth herein in their entirety.

FIELD OF INVENTION

The present disclosure relates to display technologies, and more particularly, to a display panel and an electronic apparatus.

BACKGROUND OF INVENTION

With the development of display technologies, foldable display devices have become a major development direction of display industry. The foldable display device can provide users with a large display screen to improve the visual effect when in an expanded state; and may reduce space occupied by the display device when in a folded state to facilitate storage and carrying by the user. Currently, there are many states of foldable devices, and there is a gap after a housing of an inward-folding wedge-shaped display device is closed, which is easy to have a foreign matter.

SUMMARY OF INVENTION

The present disclosure provides a display panel and an electronic apparatus, to resolve a technical problem that there is a gap after a housing of a conventional inward-folding wedge-shaped display device is closed.

In order to resolve the above problem, the present disclosure provides the following technical solutions:

An embodiment of the present disclosure provides a display panel, including:
  a housing, including a first housing portion and a second housing portion movably connected to the first housing portion;
  a supporting component, including a first supporting component and a second supporting component, the first supporting component being movably connected to the first housing portion, and the second supporting component being movably connected to the second housing portion; and
  a display panel body, attached to a side of the supporting component away from the housing, wherein
  the display panel body is configured to move along with movement of the supporting component, when the supporting component moves to a first position, the display panel body is in a bent state, the first housing portion and the second housing portion are fitted, and a first angle is formed between the first supporting component and the second supporting component to protect a bending portion formed by the display panel body.

In the display panel provided in the present embodiment of the present disclosure, when the supporting component moves to a second position, the display panel body is in a flat state, the housing and the supporting component are flat to cause the first housing portion to be level with the second housing portion, and a second angle is formed between the first supporting component and the second supporting component to support the display panel body, wherein the second angle is greater than the first angle.

In the display panel provided in the present embodiment of the present disclosure, the first housing portion is provided with a first groove, and the first supporting component is disposed inside the first groove; and the second housing portion is provided with a second groove, and the second supporting component is disposed inside the second groove.

In the display panel provided in the present embodiment of the present disclosure, both the first groove and the second groove include a groove wall and a groove bottom, and the groove wall is provided with a notch close to a movement joint of the first housing portion and the second housing portion.

In the display panel provided in the present embodiment of the present disclosure, a height of the groove wall is greater than a sum of thicknesses of the supporting component and the display panel body.

In the display panel provided in the present embodiment of the present disclosure, the groove bottom is an inclined surface, and a height of the groove wall is increased as the groove bottom extends toward the notch.

In the display panel provided in the present embodiment of the present disclosure, when the supporting component moves to the first position, the supporting component and the corresponding groove bottom are fitted; and when the supporting component moves to the second position, a third angle is formed between the supporting component and the corresponding groove bottom.

In the display panel provided in the present embodiment of the present disclosure, a magnitude of the third angle is equal to a half of a magnitude of the first angle.

In the display panel provided in the present embodiment of the present disclosure, the groove bottom is provided with a sliding groove on a side away from the notch, the supporting component is provided with a bump at a position corresponding to the sliding groove, and the bump is slidably mounted in the sliding groove.

In the display panel provided in the present embodiment of the present disclosure, the sliding groove is provided with a cylindrical hole inside, the bump is provided with a cylinder shaft, and the cylinder shaft is movably mounted in the circular hole.

An embodiment of the present disclosure further provides an electronic apparatus, including the display panel in one of the above embodiments.

In a display panel and an electronic apparatus provided in the present disclosure, A housing includes a first housing portion and a second housing portion movably connected to the first housing portion. A supporting component includes a first supporting component and a second supporting component, the first supporting component being movably connected to the first housing portion, and the second supporting component being movably connected to the second housing portion. A display panel body is attached to a side of the supporting component away from the housing, and the display panel body is configured to move along with movement of the supporting component. When the supporting component moves to a first position, the display panel body is in a bent state, the first housing portion and the second housing portion are fitted, a first angle is formed between the first supporting component and the second supporting component to protect a bending portion formed by the display panel body. By making the display panel body move with the supporting component, it is different from the opening and closing movement of the housing, so that after the display panel is folded, the housing can be completely closed in appearance without leaving a gap, resolving a problem that there is a gap after a housing of a conventional inward-folding wedge-shaped display device is closed.

BRIEF DESCRIPTION OF DRAWINGS

To describe the technical solutions of the embodiments or the existing technology more clearly, the following briefly describes the accompanying drawings required for describing the embodiments or the existing technology. Apparently, the accompanying drawings in the following description show only some embodiments of the present invention, and persons skilled in the art may still derive other drawings from these accompanying drawings without creative efforts.

DETAILED DESCRIPTION OF PREFERRED EMBODIMENTS

The following description of various embodiments is provided to exemplify the detailed embodiments of the present disclosure with reference to accompanying drawings. The directional terms mentioned in the present disclosure, such as "above", "below", "front", "back", "left", "right", "inner", "outer", and "side surface" refer to the directions in the accompanying drawings. Therefore, the directional terms are only used for illustration and understanding instead of limiting the present disclosure. In the accompanying drawings, units with similar structures are represented using same labels. In the accompanying drawings, thicknesses of some layers and regions have been exaggerated for clarity and ease of description. That is, a size and thickness of each component shown in the accompanying drawings is arbitrary, but the present disclosure is not limited thereto.

For the problem that there is a gap after a housing of a conventional inward-folding wedge-shaped display device is closed, it is found during research in the present disclosure that, a flexible screen of the conventional inward-folding wedge-shaped display device usually moves along with movement of the housing. When the inward-folding wedge-shaped display device is in a folded state, to make the flexible screen form a safe wedge-shaped bending angle, a hinge mechanism of a folding region of the inward-folding wedge-shaped display device is required to be designed in detail, so that after being bent, the hinge mechanism makes room for accommodating the extra flexible screen compared with the hinge mechanism. In this case, a folding end of the inward-folding wedge-shaped display device is thicker, and there is a gap after the housing near the folding region is closed, and the gap may have a foreign matter.

In view of this, the present disclosure provides a display panel and an electronic apparatus to resolve the above problem.

Figure 1:
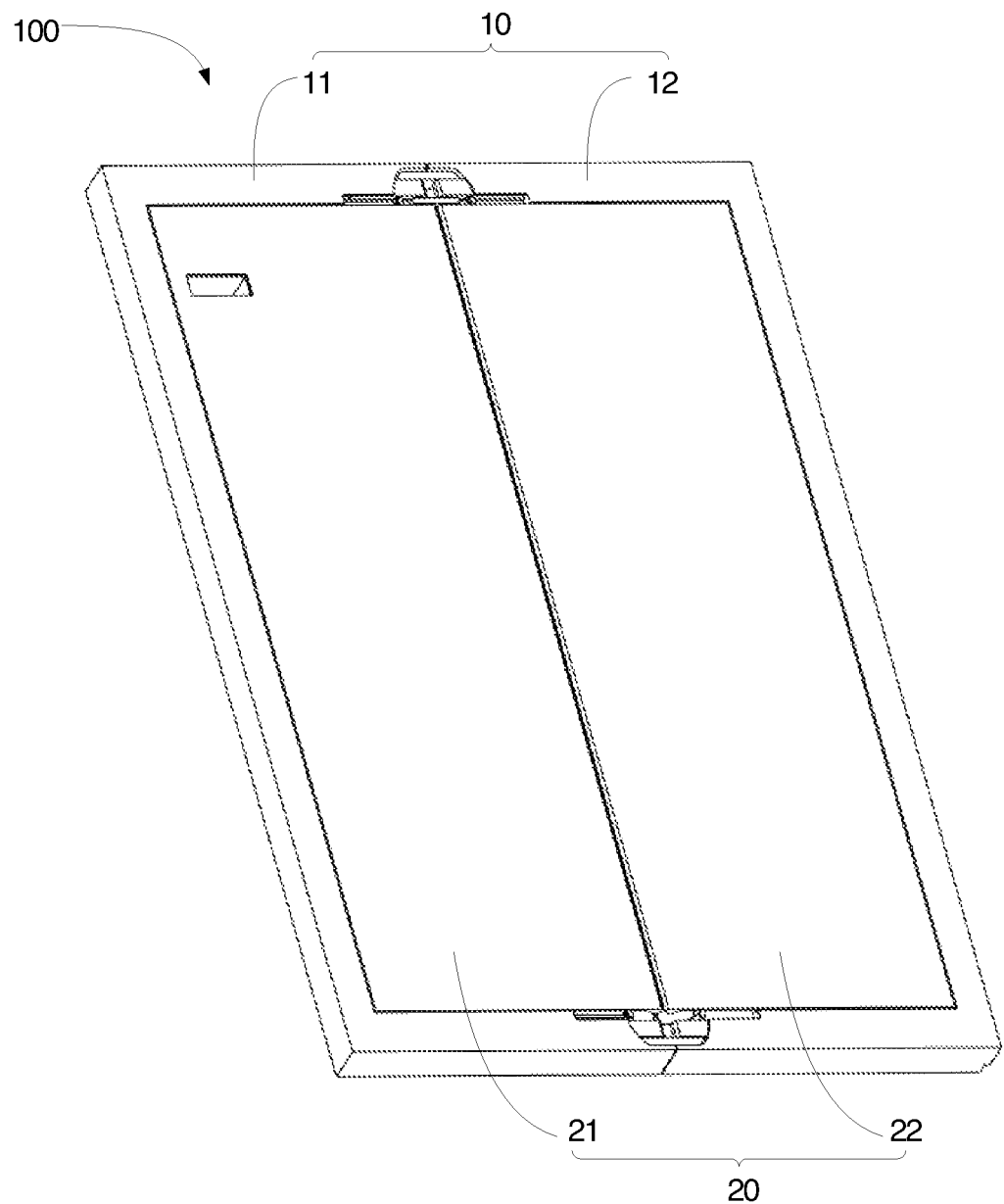
FIG. 1 is a schematic diagram of a part of structure when a display panel is flat according to an embodiment of the present disclosure.
Figure 2:
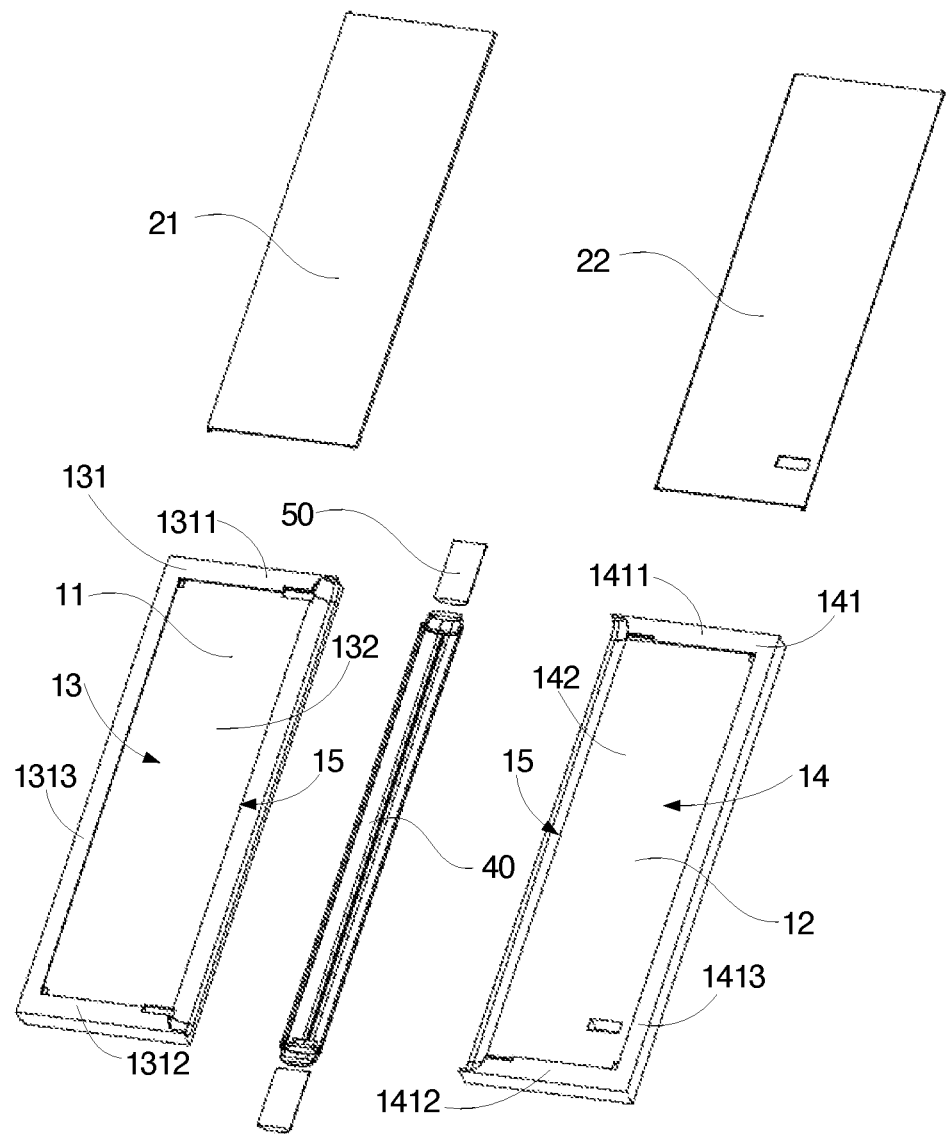
FIG. 2 is an exploded view of a display panel according to an embodiment of the present disclosure.
Figure 3:
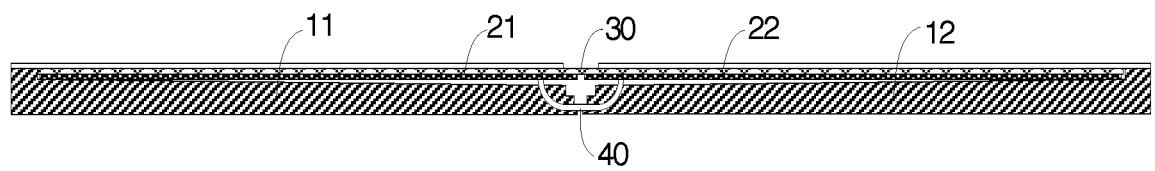
FIG. 3 is a schematic diagram of a cross sectional structure when a display panel is flat according to an embodiment of the present disclosure.
Figure 4:
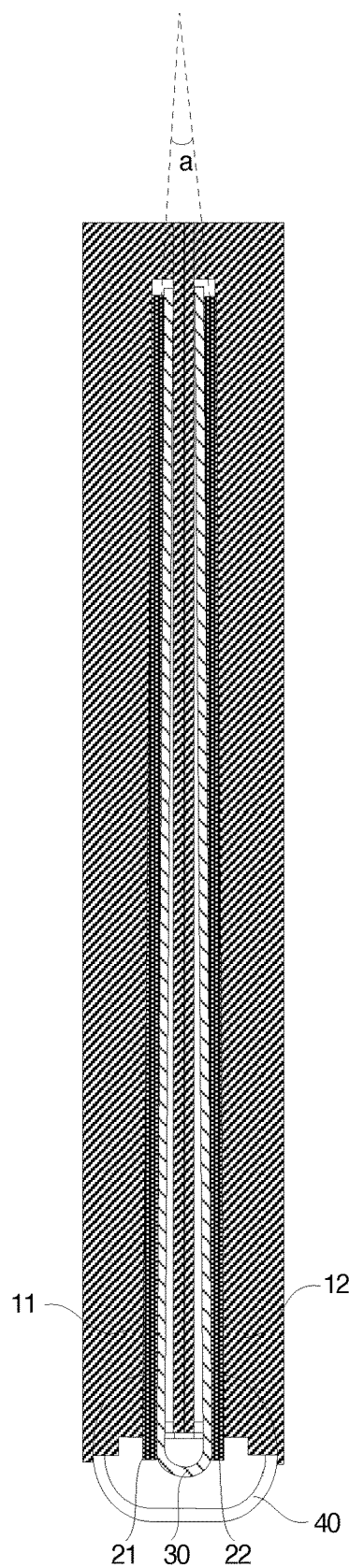
FIG. 4 is a schematic diagram of a cross sectional structure when a display panel is folded according to an embodiment of the present disclosure.
Figure 5:
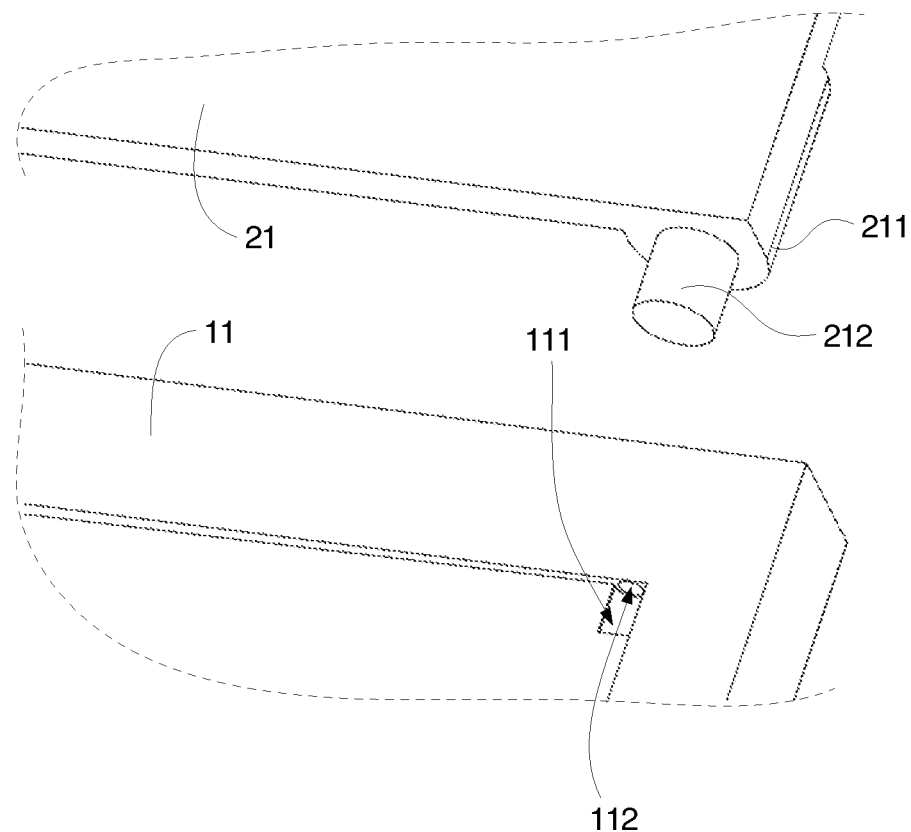
FIG. 5 is a detailed diagram of a part of a supporting component and a housing according to an embodiment of the present disclosure.
Figure 6:
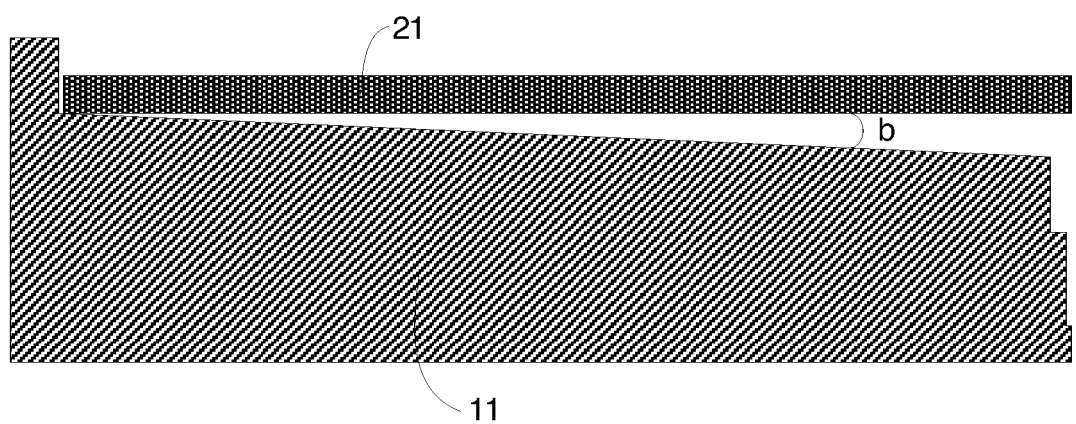
FIG. 6 is a detailed diagram of a position relationship between a supporting component and a housing according to an embodiment of the present disclosure.

Referring to FIGS. 1 to 4. FIG. 1 is a schematic diagram of a part of structure when a display panel is flat according to an embodiment of the present disclosure. FIG. 2 is an exploded view of a display panel according to an embodiment of the present disclosure. FIG. 3 is a schematic diagram of a cross sectional structure when a display panel is flat according to an embodiment of the present disclosure. FIG. 4 is a schematic diagram of a cross sectional structure when a display panel is folded according to an embodiment of the present disclosure. A display panel 100 includes a housing 10, a supporting component 20, and a display panel body 30. The display panel body 30 is attached to the supporting component 20, and the supporting component 20 is disposed inside the housing 10. The display panel 100 includes an organic light emitting display (OLED) plane, and the display panel body 30 may include a flexible substrate, a drive circuit layer, a light-emitting function layer, an encapsulation layer, and the like that are sequentially stacked on the flexible substrate. It may be understood that, the display panel body 30 in the present disclosure may include functional structures of conventional OLED, and details are not described herein again.

The OLED plane is flexible and wearable, so that the display panel body 30 can be bent or folded with the supporting component 20, and therefore, the display panel 100 can be bent and folded. An example in which the display panel 100 is foldable in the present embodiment of the present disclosure is used for description.

Described in detail, the housing 10 includes a first housing portion 11 and a second housing portion 12 movably connected to the first housing portion 11. The supporting component 20 includes a first supporting component 21 and a second supporting component 22, the first supporting component 21 being movably connected to the first housing portion 11, and the second supporting component 22 being movably connected to the second housing portion 12. The display panel body 30 is attached to a side of the supporting component 20 away from the housing 10, so that the display panel body 30 may move along with movement of the supporting component 20. The display panel body 30 may be attached to the supporting component 20 using optically clear adhesive (OCA) and other colloids.

When the supporting component 20 moves to a first position, the display panel body 30 is in a bent state, the first housing portion 11 and the second housing portion 12 are fitted, and a first angle a is formed between the first supporting component 21 and the second supporting component 22 to protect a bending portion formed by the display panel body 30. It should be noted that, the first angle a formed between the first supporting component 21 and the second supporting component 22 refers to an angle formed by extension and intersection of the first supporting component 21 and the second supporting component 22 when the supporting component 20 moves to the first position.

When the supporting component 20 moves to a second position, the display panel body 30 is in a flat state, the housing 10 and the supporting component 20 are flat to cause the first housing portion 11 to be level with the second housing portion 12, and a second angle is formed between the first supporting component 21 and the second supporting component 22 to support the display panel body 30, wherein the second angle is 180 degrees, and the second angle is greater than the first angle a. By making the display panel body 30 move with the supporting component 20, it is different from the opening and closing movement of the housing 10, so that after the display panel 100 is folded, the housing 10 can be completely closed in appearance without leaving a gap, to resolve a problem that there is a gap after a housing of a conventional inward-folding wedge-shaped display device is closed.

Optionally, the first housing portion 11 and the second housing portion 12 may be movably connected using a hinge (not shown), so that the first housing portion 11 and the second housing portion 12 can rotate relative to each other, and the display panel 100 can be folded and flatted. Certainly, to protect the hinge, the display panel 100 further includes an encapsulation mechanism 40 disposed between the first housing portion 11 and the second housing portion 12. Moreover, a detailed structure of the hinge is not limited in the present disclosure, as long as the mechanism can implement relative rotation between the first housing portion 11 and the second housing portion 12. Details are not described herein again.

The first housing portion 11 is provided with a first groove 13, and the first supporting component 21 is disposed inside the first groove 13; and the second housing portion 12 is provided with a second groove 14, and the second supporting component 22 is disposed inside the second groove 14. Both the first groove 13 and the second groove 14 include a groove wall and a groove bottom (such as a first groove wall 131, a first groove bottom 132, a second groove wall 141, and a second groove bottom 142 as shown in FIG. 2), and the groove wall is provided with a notch 15 close to a movement joint of the first housing portion 11 and the second housing portion 12. The notch 15 is configured to cause the first supporting component 21 to move in the first groove 13, and enable the second supporting component 22 to move in the second groove 14.

Described in detail, the first groove 13 includes a first groove wall 131 and a first groove bottom 132. The first groove wall 131 includes a first sub-groove wall 1311 and a second sub-groove wall 1312 that are disposed relative to each other, and a third sub-groove wall 1313 connected to the first sub-groove wall 1311 and the second sub-groove wall 1312. That is, the third sub-groove wall 1313 is located between the first sub-groove wall 1311 and the second sub-groove wall 1312, and the third sub-groove wall 1313 is disposed relative to the corresponding notch 15. The first groove bottom 132 is an inclined surface, the first groove bottom 132 extends from the third sub-groove wall 1313 to the notch 15, and heights of the first sub-groove wall 1311 and the second sub-groove wall 1312 are increased as the first groove bottom 132 extends toward the notch 15. The first sub-groove wall 1311, the second sub-groove wall 1312, the third sub-groove wall 1313, and the first groove bottom 132 form the first groove 13 with an opening on one side together.

Described in detail, referring to FIGS. 1 to 5, FIG. 5 is a detailed diagram of a part of a supporting component and a housing according to an embodiment of the present disclosure. The first supporting component 21 is disposed inside the first groove 13 and movably connected to the first housing portion 11. Described in detail, the first groove bottom 132 is provided with a first sliding groove 111 on a side away from the notch 15, the first supporting component 21 is provided with a first bump 211 at a position corresponding to the first sliding groove 111, and the first bump 211 is slidably mounted in the sliding groove 111. Further, the first sliding groove 111 is provided with a first cylindrical hole 112 inside, the first bump 211 is provided with a first cylinder shaft 212, and the first cylinder shaft 212 is movably mounted in the first cylindrical hole 112. In this case, the first supporting component 21 can rotate in the first groove 13 relative to the first housing portion 11. Certainly, a movable connection between the first supporting component 21 and the first housing portion 11 in the present disclosure is not limited thereto. In the present disclosure, the first supporting component 21 may alternatively movably connected to the first sub-groove wall 1311 and the second sub-groove wall 1312 directly. For example, cylindrical holes may be disposed on the first sub-groove wall 1311 and the second sub-groove wall 1312, and a cylinder shaft is disposed on the first supporting component 21, so that the shaft-hole fit is formed on the first supporting component 21 and the first sub-groove wall 1311 and the second sub-groove wall 1312.

In addition, the display panel body 30 is attached to the supporting component 20. When the first supporting component 21 rotates relative to the first housing portion 11, the display panel body 30 is driven to rotate relative to the first housing portion 11 together. To ensure that the rotation of the first supporting component 21 does not exceed a groove wall height of the first groove 13, heights of the first sub-groove wall 1311, the second sub-groove wall 1312, and the third sub-groove wall 1313 of the first groove 13 are all greater than a sum of thicknesses of the first supporting component 21 and the display panel body 30.

Similarly, the second groove 14 includes a second groove wall 141 and a second groove bottom 142. The second groove wall 141 includes a fourth sub-groove wall 1411 and a fifth sub-groove wall 1412 that are disposed relative to each other, and a sixth sub-groove wall 1413 connected to the fourth sub-groove wall 1411 and the fifth sub-groove wall 1412. That is, the sixth sub-groove wall 1413 is located between the third sub-groove wall 1313 and the fourth sub-groove wall 1411, and the sixth sub-groove wall 1413 is disposed relative to the corresponding notch 15. The second groove bottom 142 is also an inclined surface, the second groove bottom 142 extends from the sixth sub-groove wall 1413 to the notch 15, and heights of the fourth sub-groove wall 1411 and the fifth sub-groove wall 1412 are increased as the second groove bottom 142 extends toward the notch 15. The fourth sub-groove wall 1411, the fifth sub-groove wall 1412, the sixth sub-groove wall 1413, and the second groove bottom 142 form the second groove 14 with an opening on one side together.

The second supporting component 22 is disposed inside the second groove 14 and movably connected to the second housing portion 12. The second groove bottom 142 is provided with a second sliding groove (not shown, referring to the first sliding groove 111 of the first housing portion 11 in FIG. 5) on a side away from the notch 15, the second supporting component 22 is provided with a second bump (not shown, referring to the first bump 211 of the first supporting component 21 in FIG. 5) at a position corresponding to the second sliding groove, and the second bump is slidably mounted in the second sliding groove. Further, the second sliding groove is provided with a second cylindrical hole (not shown, referring to the first cylindrical hole 112 of the first housing portion 11 in FIG. 5) inside, the second bump is provided with a second cylinder shaft (not shown, referring to the first cylinder shaft 212 of the first supporting component 21 in FIG. 5), and the second cylinder shaft is movably mounted in the second cylindrical hole. In this case, the second supporting component 22 can rotate in the second groove 14 relative to the second housing portion 12. Certainly, a movable connection between the second supporting component 22 and the second housing portion 12 in the present disclosure is not limited thereto. In the present disclosure, the second supporting component 22 may alternatively movably connected to the fourth sub-groove wall 1411 and the fifth sub-groove wall 1412 directly. For example, cylindrical holes may be disposed on the fourth sub-groove wall 1411 and the fifth sub-groove wall 1412, and a cylinder shaft is disposed on the second supporting component 22, so that the shaft-hole fit is formed on the second supporting component 22 and the fourth sub-groove wall 1411 and the fifth sub-groove wall 1412.

In addition, the display panel body 30 is attached to the supporting component 20. When the second supporting component 22 rotates relative to the second housing portion 12, the display panel body 30 is driven to rotate relative to the second housing portion 12 together. To ensure that the rotation of the second supporting component 22 does not exceed a groove wall height of the second groove 14, heights of the fourth sub-groove wall 1411, the fifth sub-groove wall 1412, and the sixth sub-groove wall 1413 of the second groove 14 are all greater than a sum of thicknesses of the second supporting component 22 and the display panel body 30.

When the supporting component 20 moves to the first position, the display panel 100 is in a bent state, and the supporting component 20 and the corresponding groove bottom are fitted, so that a first angle a is formed between the first supporting component 21 and the second supporting component 22, and the first angle a is greater than 0 degree. Described in detail, the first housing portion 11 drives the first supporting component 21 to rotate, and the second housing portion 12 drives the second supporting component 22 to rotate. When the supporting component 20 moves to the first position, the first supporting component 21 and the first groove bottom 132 of the first groove 13 are fitted, and the second supporting component 22 and the second groove bottom 142 of the second groove 14 are fitted, so that the first angle a is formed between the first supporting component 21 and the second supporting component 22. In this case, a void space is formed by the first supporting component 21 and the second supporting component 22 at a position close to a movement joint of the first housing portion 11 and the second housing portion 12, to accommodate an extra portion of the display panel body 30 caused by bending, so that the display panel body 30 forms a wedge shape at the movement joint of the first housing portion 11 and the second housing portion 12.

The display panel body 30 is attached to the first supporting component 21 and the second supporting component 22, so that the display panel body 30 moves along with movement of the first supporting component 21 and the second supporting component 22, and a movement path is different from a movement path between the first housing portion 11 and the second housing portion 12. In this case, when the supporting component 20 moves to the first position, while ensuring that the display panel body 30 forms a wedge-shaped bending structure, the first housing portion 11 and the second housing portion 12 can be closed completely, so that there is no gap between the first housing portion 11 and the second housing portion 12.

Referring to FIGS. 1 to 6, FIG. 6 is a detailed diagram of a position relationship between a supporting component and a housing according to an embodiment of the present disclosure. When the supporting component 20 moves to the second position, the display panel body 30 is in a flat state, the housing 10 and the supporting component 20 are flat to cause the first housing portion 11 to be level with the second housing portion 12, and a second angle is formed between the first supporting component 21 and the second supporting component 22 to support the display panel body 30, wherein the second angle is 180 degrees, and the second angle is greater than the first angle a. Because the first groove bottom 132 of the first groove 13 of the first housing portion 11 is an inclined surface, when the supporting component 20 moves to the second position, a third angle b is formed between the first supporting component 21 and the first groove bottom 132, so that there is a void space between the first supporting component 21 and the first groove bottom 132. When the first supporting component 21 moves back and forth between the first position and the second position, the first supporting component 21 can swing back and forth in the void space. A magnitude of the third angle b is equal to a half of a magnitude of the first angle a, and the magnitude of the third angle b also reflects a slope size of the first groove bottom 132 to some extent. Further, the magnitude of the third angle b also depends on a size of a bending radius of the display panel body 30, a relatively large third angle b may be set when the display panel body 30 has a relatively large bending radius.

Correspondingly, because the second groove bottom 142 of the second groove 14 of the second housing portion 12 is an inclined surface, when the supporting component 20 moves to the second position, a third angle b is formed between the second supporting component 22 and the second groove bottom 142, so that there is a void space between the second supporting component 22 and the second groove bottom 142. When the second supporting component 22 moves back and forth between the first position and the second position, the second supporting component 22 can swing back and forth in the void space. A magnitude of the third angle b is equal to a half of a magnitude of the first angle a, and the magnitude of the third angle b also reflects a slope size of the second groove bottom 142 to some extent. Further, the magnitude of the third angle b also depends on a size of a bending radius of the display panel body 30, a relatively large third angle b may be set when the display panel body 30 has a relatively large bending radius.

In addition, to form the third angle b between the first supporting component 21 and the first groove bottom 132 and between the second supporting component 22 and the second groove bottom 142, a limiting mechanism 50 is further required to be disposed at the movement joint of the first housing portion 11 and the second housing portion 12. When the first supporting component 21 and the second supporting component 22 move to the second position, the limiting mechanism 50 can limit the first supporting component 21 and the second supporting component 22, so that the first supporting component 21 and the first groove bottom 132, and the second supporting component 22 and the second groove bottom 142 keep the third angle b.

An embodiment of the present disclosure further provides an electronic apparatus, including the display panel 100 in one of the above embodiments. The electronic apparatus includes electronic devices, such as a mobile phone, a tablet computer, and a wearable watch.

It may be learned from the above embodiments that:
the present disclosure provides a display panel and an electronic apparatus. A housing in the display panel includes a first housing portion and a second housing portion movably connected to the first housing portion. A supporting component includes a first supporting component and a second supporting component, the first supporting component being movably connected to the first housing portion, and the second supporting component being movably connected to the second housing portion. A display panel body is attached to a side of the supporting component away from the housing, and the display panel body is configured to move along with movement of the supporting component. When the supporting component moves to a first position, the display panel body is in a bent state, the first housing portion and the second housing portion are fitted, and a first angle is formed between the first supporting component and the second supporting component to protect a bending portion formed by the display panel body. By making the display panel body move with the supporting component, it is different from the opening and closing movement of the housing, so that after the display panel is folded, the housing can be completely closed in appearance without leaving a gap, resolving a problem that there is a gap after a housing of a conventional inward-folding wedge-shaped display device is closed.

In the above embodiments, the descriptions of the embodiments have their respective focuses. For a part that is not described in detail in an embodiment, reference may be made to related descriptions in other embodiments.

The embodiments of the present disclosure are described above in detail. Although the principles and implementations of the present disclosure are described using detailed examples in the specification, the above descriptions of the embodiments are only intended to help understand the technical solutions and core idea of the present disclosure. It should be understood by a person of ordinary skill in the art that, modifications can be made to the technical solutions described in the above embodiments, or equivalent replacements can be made to some technical features in the technical solutions; and these modifications or replacements will not cause the essence of corresponding technical solutions to depart from the scope of the technical solutions in the embodiments of the present disclosure.

What is claimed is:

1. A display panel, comprising:
   a housing, comprising a first housing portion and a second housing portion movably connected to the first housing portion;
   a supporting component, comprising a first supporting component and a second supporting component, the first supporting component being movably connected to the first housing portion, and the second supporting component being movably connected to the second housing portion; and
   a display panel body, attached to a side of the supporting component away from the housing, wherein
   the display panel body is configured to move along with movement of the supporting component, when the supporting component moves to a first position, the display panel body is in a bent state, the first housing portion and the second housing portion are fitted, and a first angle is formed between the first supporting component and the second supporting component to protect a bending portion formed by the display panel body,
   the first housing portion is provided with a first groove, and the first supporting component is disposed inside the first groove; and the second housing portion is provided with a second groove, and the second supporting component is disposed inside the second groove,
   both the first groove and the second groove comprise a groove wall and a groove bottom, and the groove wall is provided with a notch close to a movement joint of the first housing portion and the second housing portion, and
   the groove bottom is provided with a sliding groove on a side away from the notch, the supporting component is provided with a bump at a position corresponding to the sliding groove, and the bump is slidably mounted in the sliding groove.

2. The display panel as claimed in claim 1, wherein when the supporting component moves to a second position, the display panel body is in a flat state, the housing and the supporting component are flat to cause the first housing portion to be level with the second housing portion, and a second angle is formed between the first supporting component and the second supporting component to support the display panel body, wherein the second angle is greater than the first angle.

3. The display panel as claimed in claim 1, wherein a height of the groove wall is greater than a sum of thicknesses of the supporting component and the display panel body.

4. The display panel as claimed in claim 2, wherein the groove bottom is an inclined surface, and a height of the groove wall is increased as the groove bottom extends toward the notch.

5. The display panel as claimed in claim 4, wherein when the supporting component moves to the first position, the supporting component and the corresponding groove bottom are fitted; and when the supporting component moves to the second position, a third angle is formed between the supporting component and the corresponding groove bottom.

6. The display panel as claimed in claim 5, a magnitude of the third angle is equal to a half of a magnitude of the first angle.

7. The display panel as claimed in claim 1, wherein the sliding groove is provided with a cylindrical hole inside, the bump is provided with a cylinder shaft, and the cylinder shaft is movably mounted in the circular hole.

8. An electronic apparatus, comprising a display panel, the display panel comprising:
   a housing, comprising a first housing portion and a second housing portion movably connected to the first housing portion;
   a supporting component, comprising a first supporting component and a second supporting component, the first supporting component being movably connected to the first housing portion, and the second supporting component being movably connected to the second housing portion; and
   a display panel body, attached to a side of the supporting component away from the housing, wherein
   the display panel body is configured to move along with movement of the supporting component, when the supporting component moves to a first position, the display panel body is in a bent state, the first housing portion and the second housing portion are fitted, and a first angle is formed between the first supporting component and the second supporting component to protect a bending portion formed by the display panel body,
   the first housing portion is provided with a first groove, and the first supporting component is disposed inside the first groove; and the second housing portion is provided with a second groove, and the second supporting component is disposed inside the second groove, both the first groove and the second groove comprise a groove wall and a groove bottom, and the groove wall is provided with a notch close to a movement joint of the first housing portion and the second housing portion, and the groove bottom is provided with a sliding groove on a side away from the notch, the supporting component is provided with a bump at a position corresponding to the sliding groove, and the bump is slidably mounted in the sliding groove.

9. The electronic apparatus as claimed in claim 8, wherein when the supporting component moves to a second position, the display panel body is in a flat state, the housing and the supporting component are flat to cause the first housing portion to be level with the second housing portion, and a second angle is formed between the first supporting component and the second supporting component to support the display panel body, wherein the second angle is greater than the first angle.

10. The electronic apparatus as claimed in claim 8, wherein a height of the groove wall is greater than a sum of thicknesses of the supporting component and the display panel body.

11. The electronic apparatus as claimed in claim 9, wherein the groove bottom is an inclined surface, and a height of the groove wall is increased as the groove bottom extends toward the notch.

12. The electronic apparatus as claimed in claim 11, wherein when the supporting component moves to the first position, the supporting component and the corresponding groove bottom are fitted; and when the supporting component moves to the second position, a third angle is formed between the supporting component and the corresponding groove bottom.

13. The electronic apparatus as claimed in claim 12, a magnitude of the third angle is equal to a half of a magnitude of the first angle.

14. The electronic apparatus as claimed in claim 8, wherein the sliding groove is provided with a cylindrical hole inside, the bump is provided with a cylinder shaft, and the cylinder shaft is movably mounted in the circular hole.

* * * * *